(12) United States Patent
Lee et al.

(10) Patent No.: US 7,101,758 B2
(45) Date of Patent: Sep. 5, 2006

(54) POLY-ETCHING METHOD FOR SPLIT GATE FLASH MEMORY CELL

(75) Inventors: Hsiang-Fan Lee, Hsin-Chu (TW); Shih-Wei Wang, Hsin-Chu (TW); Yi-Jiun Lin, Taipei (TW); Kuo-Wei Chu, Hsin-Chu (TW); Ching-Sen Kuo, Taipei (TW); Chia-Tong Ho, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 273 days.

(21) Appl. No.: 10/686,079

(22) Filed: Oct. 15, 2003

(65) Prior Publication Data

US 2005/0202631 A1   Sep. 15, 2005

(51) Int. Cl.
 *H01L 21/8247* (2006.01)
(52) U.S. Cl. .................................................. 438/257

(58) Field of Classification Search ......... 438/257–267
See application file for complete search history.

(56) References Cited

U.S. PATENT DOCUMENTS

| 6,426,524 B1 * | 7/2002 | Lam et al. ................... 257/296 |
| 2004/0201059 A1 * | 10/2004 | Ding ........................... 257/315 |

* cited by examiner

*Primary Examiner*—Richard A. Booth
(74) *Attorney, Agent, or Firm*—Tung & Assoc.

(57) ABSTRACT

A method for forming triple polysilicon split gate electrodes in a EEPROM flash memory array providing a first gate structure; blanket depositing a first polysilicon layer over the first gate structure; etching back the first polysilicon layer according to a first dry etching process; blanket depositing a second dielectric insulating layer over the first polysilicon layer; blanket depositing a second polysilicon layer over the second dielectric insulating layer; and, lithographically patterning and dry etching according to a respective third and fourth dry etching process through a thickness portion of the respective second and first polysilicon layers to respectively form third and second polysilicon gate electrodes.

20 Claims, 3 Drawing Sheets

POLY-ETCHING METHOD FOR SPLIT GATE FLASH MEMORY CELL

FIELD OF THE INVENTION

This invention generally relates to processing methods for forming semiconductor device structures, and more particularly to a method for forming a triple polysilicon split gate EEPROM flash memory device.

BACKGROUND OF THE INVENTION

In the flash EEPROM (Electrically Erasable Programmable Read Only Memories) including split gate FET devices, the level of voltage in the respective gate electrodes and tunneling current through respective insulating layers is frequently dependent on gate electrode profiles. For example, Fowler-Nordheim tunneling has an exponential field dependence and the electric field produced at electrode interfaces can be strongly affected by electrode profiles.

A recurring processing problem in forming EEPROM devices, is the tendency for polysilicon residual material to form in undesired areas of the memory cell, including non-active areas during Reactive ion etch (RIE) processes. RIE etch processes are increasingly used for etching the various polysilicon electrodes in EEPROM flash memory devices for example in self-aligned stacked configurations.

For example, in a particular type of EEPROM flash memory cell, a triple poly split gate configuration is utilized where each memory cell has four terminals including source, drain, select gate, and control gate. The selection of a particular memory cell for programming is dependent only on the voltage applied to the particular select gate and the particular source. Consequently, this permits a variable amount of voltage to be applied to the control gate during programming, which controls the amount of electrons injected onto the floating gate. Thus, more than one level of charge may be stored on the floating gate of each memory cell.

In the formation of polysilicon floating gate and control electrodes in a triple poly split gate configuration, a consistent and predictable profile of the polysilicon structure including the absence of residual polysilicon is critical to proper electrical functioning of the device. As design rules have decreased, achieving acceptable etching profiles of the polysilicon structures has become increasingly difficult due to several hard to control RIE etching phenomena including polysilicon residue formation and micro-trenching as a result of secondary plasma ion bombardment. In addition, problems are presented in RIE etching processes where different doping levels of polysilicon layers and polysilicon layer surface topography cause variable etching rates. In particular in the triple poly split gate configuration, using three layers of polysilicon, the variable topography of the polysilicon layers tends to cause undesirable etching phenomenon due to etching at different rates through different materials at particular points in the etching process thereby contributing to the undesired deposition of etching residues. The undesired etching residues including polysilicon residues tend to form on gate profiles thereby altering electric fields and consequent electron tunneling behavior as well as forming on active and non-active areas of a memory cell matrix thereby reducing yield and reliability of the memory cell matrix.

There is therefore a need in the EEPROM device processing art to develop improved etching processes to improve the etching profiles of gate electrode structures while reducing etching residues including triple-poly split gate configuration memory cells to thereby improve the yield and reliable operation of split gate flash memory devices.

It is therefore an object of the invention to provide improved etching profiles of gate electrode structures while reducing etching residues including triple-poly split gate configuration memory cells to thereby improve the yield and reliable operation of split gate flash memory devices, while overcoming other deficiencies and shortcomings of the prior art.

SUMMARY OF THE INVENTION

To achieve the foregoing and other objects, and in accordance with the purposes of the present invention as embodied and broadly described herein, the present invention provides a method for forming triple polysilicon split gate electrodes in a EEPROM flash memory array.

In a first embodiment, the method includes providing a first gate structure; blanket depositing a first polysilicon layer over the first gate structure; etching back the first polysilicon layer according to a first dry etching process; blanket depositing a second dielectric insulating layer over the first polysilicon layer; blanket depositing a second polysilicon layer over the second dielectric insulating layer; and, lithographically patterning and dry etching according to a respective third and fourth dry etching process through a thickness portion of the respective second and first polysilicon layers to respectively form third and second polysilicon gate electrodes.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to an exemplary embodiment including the formation of a triple poly split gate flash memory device, it will be appreciated that the method of the present invention may be advantageously used in the formation of any stacked polysilicon structure where the staked polysilicon structure may be advantageously etched back prior to deposition of an overlying polysilicon layer to produce a smoother etching surface topography and consequently more rounded polysilicon gate profiles with improved electrical properties and reduced polysilicon etching residues in a subsequent etching process. For example, in one embodiment, the triple poly split gate configuration includes configurations as outlined in U.S. Pat. No. 5,668,757, which is hereby incorporated by reference in its entirety.

Figure 1A:
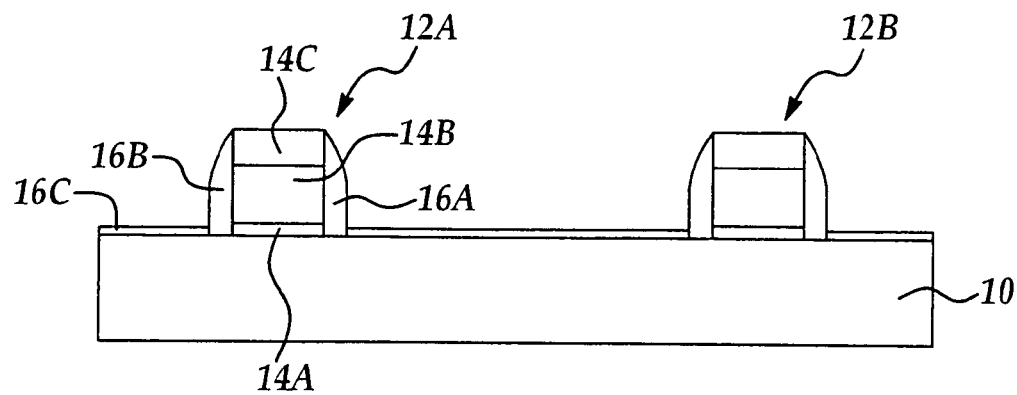
FIGS. 1A–1F are cross sectional schematic views of a portion of an exemplary triple poly split gate flash memory device at stages in manufacture according to an embodiment of the present invention.

Shown in FIG. 1A are gate structures 12A and 12B formed by conventional methods over silicon substrate (e.g., wafer) 10. It will be appreciated that doped regions (not shown) are included in the silicon substrate. For example, a gate oxide portion e.g., 14A, polysilicon gate electrode portion 14B, and interpoly insulating layer 14C are formed by conventional methods. For example, a stack of layers including a silicon oxide layer is thermally grown by conventional methods to conventional thicknesses, e.g., 50 Angstroms to 150 Angstroms followed by deposition of a polysilicon layer to a thickness between about 1000 Angstroms and 1500 Angstroms depending on design constraints for CMOS technology. A dielectric insulating layer, also referred to as a first interpoly layer, preferably a high temperature oxide (HTO) layer, for example $SiO_2$, is thermally grown under dry or wet conditions over the polysilicon layer, for example to a thickness of between about 800 Angstroms and about 900 Angstroms. It will be appreciated that the first interpoly layer may be formed of an ONO (oxide-nitride-oxide) layer formed by known methods in the art.

The stacked layers are then lithographically patterned and etched by conventional methods to form a gate structure e.g., 12A, having a lowermost gate oxide layer 14A, a polysilicon select gate 14B, and an upper most HTO spacer 14C. Adjacent first dielectric sidewall spacers e.g., 16A, 16B, for example, formed of silicon nitride (e.g., $Si_3N_4$), silicon oxynitride or silicon oxide ($SiO_2$) are then provided along the sidewalls of the gate structure e.g., 12A, followed by thermally growing a tunnel oxide layer e.g., 16C adjacent the gate structures e.g., 12A and 12B, for example, from about 100 Angstroms to about 200 Angstroms in thickness. It will be appreciated that the sizes and thicknesses of the various layers are scaleable depending on the desired memory cell size and CMOS critical dimensions.

Figure 1B:
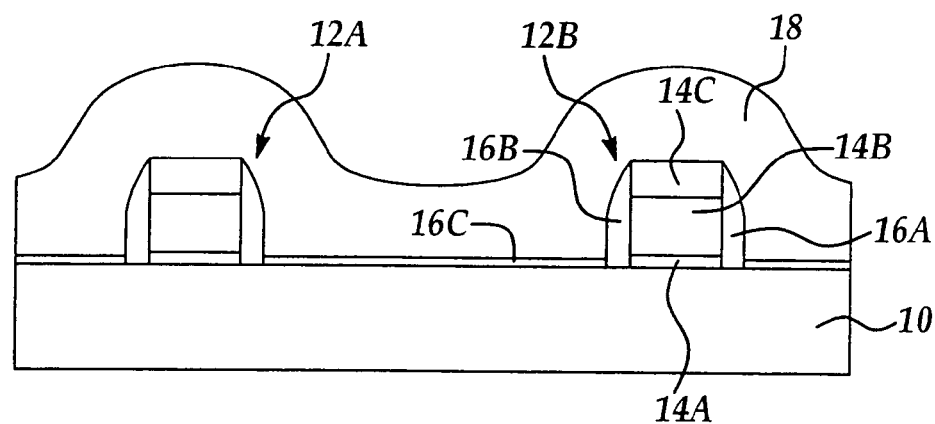

Referring to FIG. 1B, in an aspect of the invention a second polysilicon layer 18 is then deposited by a conventional process, for example LPCVD or PECVD to a thickness about a factor of about 1.0 to about 2.5 of the final desired thickness of the second polysilicon layer 18, more preferably about a factor from about 1.0 to about 2.0 of the final desired thickness, for example from about 1500 Angstroms to about 3000 Angstroms. It will be appreciated that the polysilicon layers described herein may be deposited with in-situ doping by conventional methods.

Figure 1C:
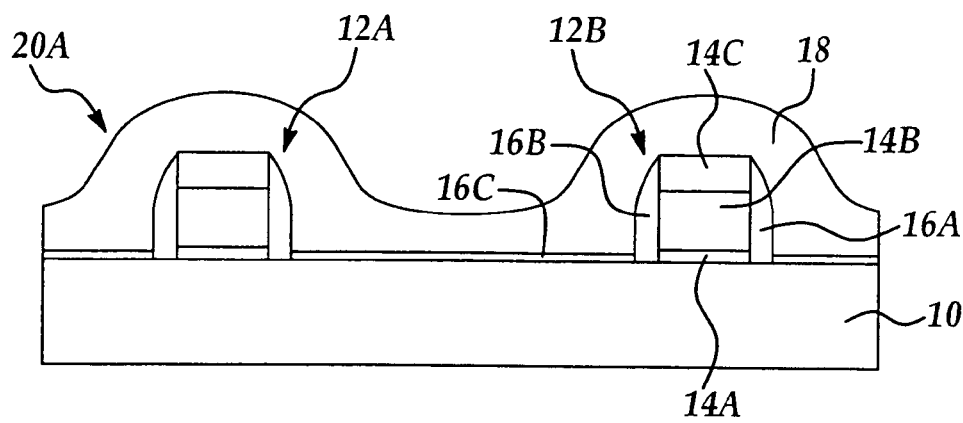

Referring to FIG. 1C, following the second polysilicon layer 18 deposition, the second polysilicon layer 18 is etched back in a dry etching process to a desired polysilicon layer thickness, for example having a thickness between about 1000 Angstroms and about 1500 Angstroms. Preferably a chemical dependent etching (CDE) process is used which includes a downstream etching process where the plasma is created upstream from the plasma wafer and transported down stream to contact the wafer where primarily chemically dependent etching takes place without plasma ion bombardment energies contributing to the etching process. The CDE process advantageously contributes to more uniform etching and consequently a smoother polysilicon layer topography without plasma etching damage such as microtrenching of the polysilicon.

For example, it has been found that the deposition of a thicker than desired polysilicon second layer followed by an etchback process according to preferred embodiments results in a lower profile angle of the polysilicon layer topography adjacent the gate structure e.g., 12A and 12B at e.g., 20A, resulting in a less sharply cornered angle in a subsequently formed floating gate electrode area portion overlying the HTO layer 14C. Such a relatively smoother polysilicon layer topography formed by the etchback process has been found to be beneficial in both the electrical properties of read and write operations in a final floating gate structure, believed to be due to reducing a relatively higher electric field area (sharply cornered) in the floating gate structure. In addition, the smoother polysilicon layer topography reduces polysilicon etching residues in subsequent polysilicon dry etching operations, for example in defining the overlying polysilicon control gate, as well as avoiding residual etching deposition of the second interpoly layer on active areas as explained below.

Figure 1D:
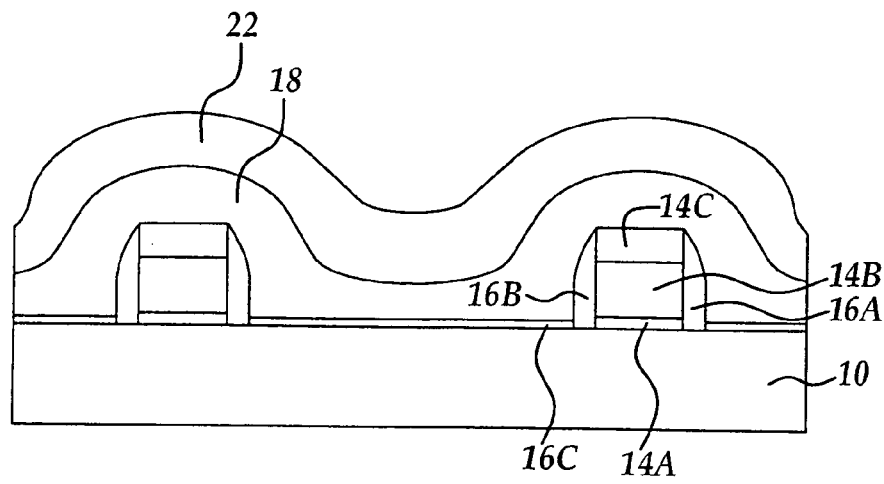

Referring to FIG. 1D, following the second polysilicon layer 18 etchback process, a dielectric anti-reflectance coating, (DARC) layer 22, also referred to as a bottom anti anti-reflectance coating (BARC), for example silicon oxynitride (e.g., SiON) is deposited to a thickness between about 600 Angstroms and about 1500 Angstroms, more preferably between about 1000 Angstroms and about 1500 Angstroms. The second polysilicon layer 18 including the DARC layer 22 is then patterned by a conventional photolithographic process and dry etched by conventional processes to define a memory cell array (not shown) area of the polysilicon layer 18 over the gate structures e.g., 12A and 12B. For example, a first breakthrough etching process to breakthrough the DARC layer 22 using a fluorocarbon etching chemistry is first used to expose the underlying polysilicon layer 18. A conventional polysilicon etching chemistry, for example a $CF_4$/$HBr$/$Cl_2$ etching chemistry is then used to etch through portions of the polysilicon layer 18 to define active areas of columns or rows (not shown) for subsequent formation of floating gates over the select gates in a memory cell array or matrix as is known in the art. In another aspect of the invention, the deposition of the DARC layer 22 at preferred thicknesses additionally has the effect of further smoothing out the topography of the process surface. Although the reason is not entirely clear, the extended breakthrough etch process by using the preferred DARC layer thicknesses operates to reduce the formation of polysilicon etching residues (stringers) over active and non-active areas of the memory cell during the etching process. The DARC layer 22 is subsequently removed by a dry etching process following the polysilicon etching process.

Figure 1E:
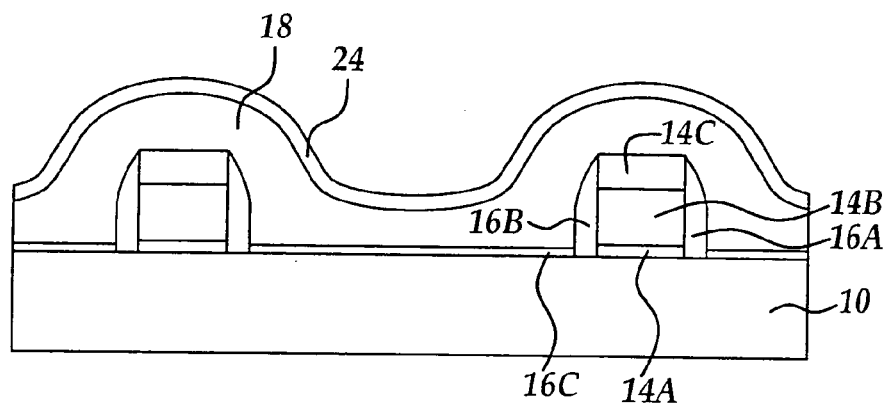

Referring to FIG. 1E, following defining active areas of the second polysilicon layer 18, and removing the DARC layer 22, a second insulating interpoly layer 24, preferably a silicon oxide/silicon nitride/silicon oxide (ONO) stacked layer is deposited by known methods over the second polysilicon layer 18, for example having an equivalent oxide thickness (EOT) of about 200 Angstroms to about 300 Angstroms.

Figure 1F:
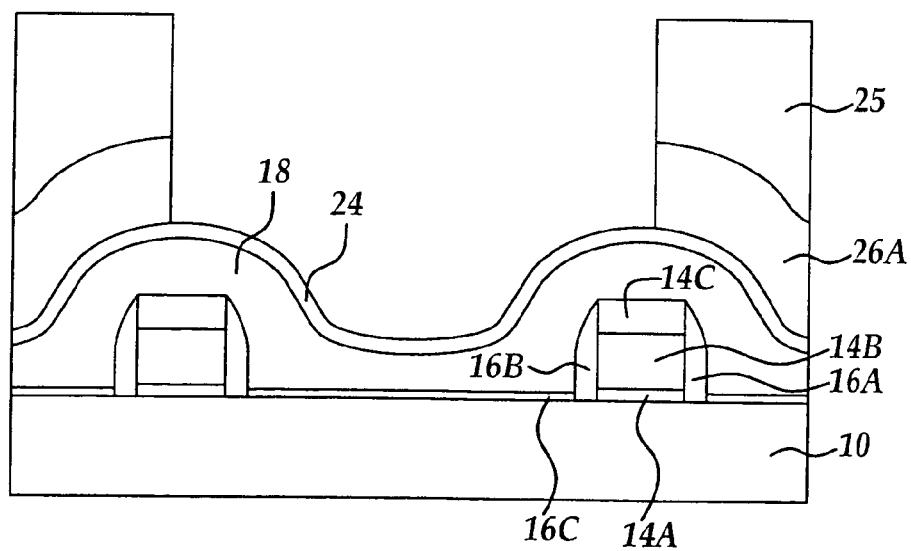

Referring to FIG. 1F, a third polysilicon layer is then deposited over the second interplay layer 24 by conventional methods to a thickness of between about 4000 Angstroms and 7500 Angstroms. A conventional photolithographic process including depositing and patterning resist layer 25 followed by a dry etching stopping on the second interpoly layer 24 is then carried out to first define polysilicon control gate portion 26A. It will be appreciated that the geometry of the alignment of the control gate portion with respect to the underlying floating gate, select gate, and source and drain regions may vary. In the exemplary embodiment shown, the control gate portion 26A is shown aligned about midway over the select gate 14B and HTO spacer 14C and is self-aligned with the subsequently formed underlying floating gate.

The floating gate portion is then defined by conventional methods in a second dry etching process to form a self-aligned floating gate portion by conventional methods by etching through a thickness of the second polysilicon layer to expose the tunnel oxide layer with the second interpoly layer 24 acting as an etching hardmask. Although not shown, it will be appreciated that the floating gate portion and control gate portion 26A may be partially aligned over a source region in the silicon substrate 10 (not shown), which may varied in dimension by subsequent ion implantation processes as are known in the art.

Preferably, the second dry etching process includes a CDE process for at least a final portion of the dry etching process including an overetch process thereby advantageously avoiding damage to the second polysilicon layer surface and tunnel oxide layer overlying the silicon substrate. For example, a conventional RIE etching process tends to cause damage as a result of ion bombardment, for example causing micro-trenching due to preferential etching as underlying oxide layers are exposed in the etching process.

Figure 2:
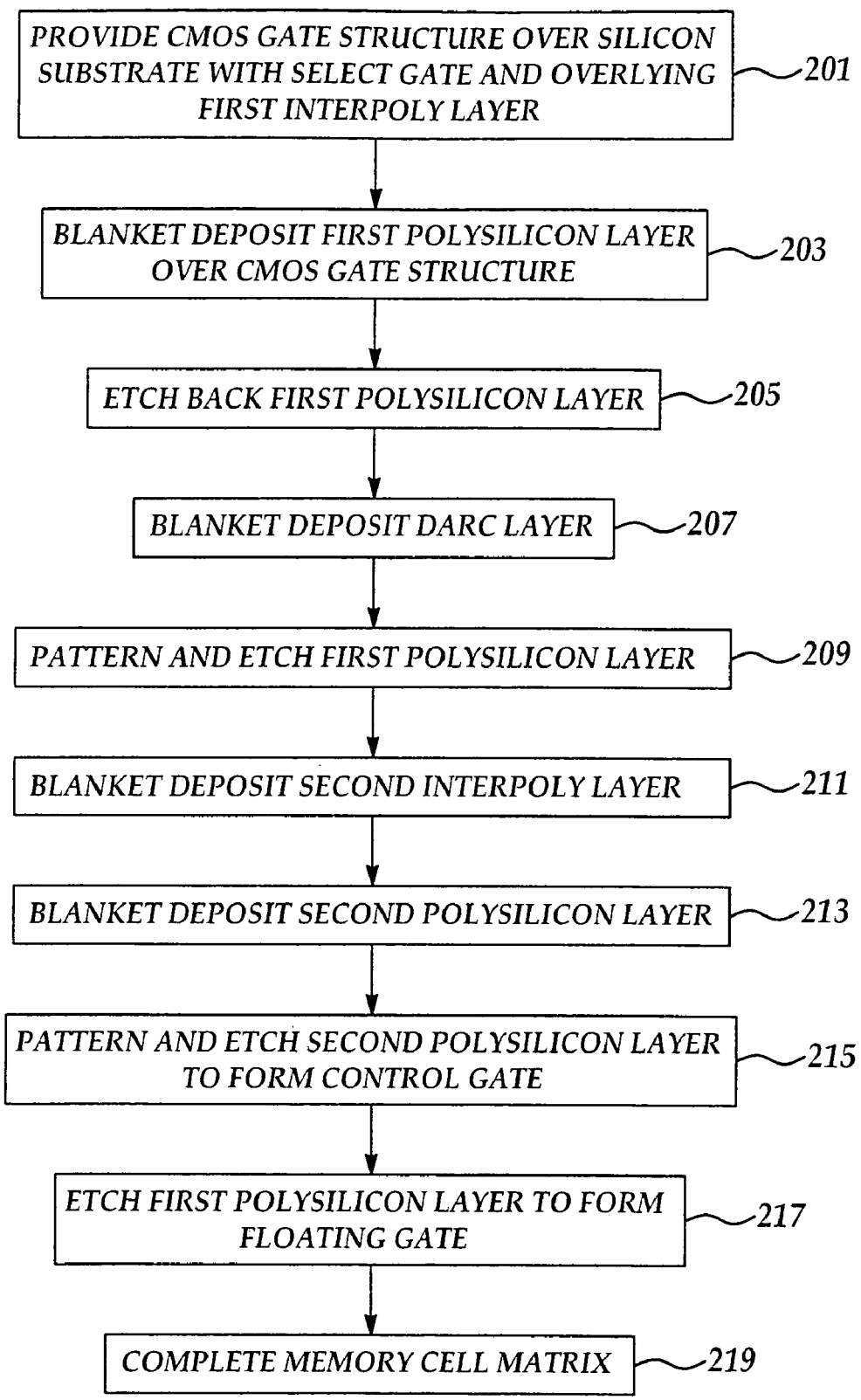
FIG. 2 is a process flow diagram including several embodiments of the present invention.

Referring to FIG. 2 is a process follow diagram including several embodiments of the present invention. In process 201, a first CMOS gate structure including a polysilicon select electrode with underlying gate oxide and overlying first interpoly layer is provided over a silicon substrate. In process 203, a first polysilicon layer is blanket deposited to cover the first CMOS gate structure to a thickness greater than a final desired thickness. In process 205, a dry etchback process is carried out to etch through a portion of the first polysilicon layer leaving a final desired polysilicon layer thickness for forming a floating gate. In process 207 a DARC layer having a preferred thickness is deposited over the first polysilicon layer. In process 209, a polysilicon dry etching process is carried out to etch the first polysilicon layer to define active areas in a memory cell matrix. In process 211, a second interpoly layer, preferably an ONO layer is deposited over the second polysilicon layer. In process 213, a second polysilicon layer is deposited over the second interpoly layer. In process 215, the second polysilicon layer is patterned in a lithographic process and etched in a polysilicon dry etching process to define a polysilicon control gate. In process 217, the first polysilicon layer is etched through a thickness in a polysilicon etching process to define a floating gate. In process 219, conventional processes are carried out to complete the triple-poly split gate memory cell matrix.

The preferred embodiments, aspects, and features of the invention having been described, it will be apparent to those skilled in the second art that numerous variations, modifications, and substitutions may be made without departing from the spirit of the invention as disclosed and further claimed below.

What is claimed is:

1. A method for forming triple polysilicon split gate electrodes in an EEPROM flash memory array comprising the steps of:
    providing a gate structure comprising a gate dielectric formed over a semiconductor substrate, an overlying first polysilicon electrode and an overlying first dielectric insulating layer;
    forming a first polysilicon layer over the gate structure;
    etching back the first polysilicon layer through a portion of the first polysilicon layer thickness according to a first dry etching process to partially smooth the first polysilicon layer topography;
    forming a second dielectric insulating layer over the first polysilicon layer;
    forming a second polysilicon layer over the second dielectric insulating layer; and,
    then lithographically patterning and dry etching according to respective sequential dry etching processes through a thickness portion of the respective second and first polysilicon layers to respectively form third and second polysilicon gate electrodes.

2. The method of claim 1, wherein at least the first dry etching process comprises a downstream chemically dependent etching (CDE) process.

3. The method of claim 1, wherein the first polysilicon layer is deposited to a thickness greater by a factor of about 1 to about 2.5 compared to a final thickness following the step of etching back.

4. The method of claim 1, following the step of etching back and prior to the step of forming a second dielectric insulating layer, further comprising the steps of:
    forming a dielectric anti-reflectance coating (DARC) layer over the first polysilicon layer; and,
    lithographically patterning and etching according to a second dry etching process through a thickness portion of the first polysilicon layer.

5. The method of claim 1, wherein the first polysilicon gate electrode comprises a select gate, the second polysilicon gate electrode comprises a floating gate and the third polysilicon gate electrode comprises a control gate.

6. The method of claim 1, wherein the first and second dielectric insulating layers are selected from the group consisting of thermally grown silicon oxide and sequential layers of silicon oxide/silicon nitride/silicon oxide.

7. The method of claim 1, wherein the first dielectric insulating layer comprises thermally grown silicon oxide.

8. The method of claim 1, wherein the second dielectric insulating layer comprises sequential layers of silicon oxide/silicon nitride/silicon oxide (ONO).

9. The method of claim 1, wherein the third polysilicon gate electrode is formed comprising a first edge aligned with an underlying edge of the second polysilicon gate electrode which is aligned over a portion of the first polysilicon gate electrode.

10. The method of claim 1, wherein the sequential dry etching processes comprises a downstream chemically dependent etching (CDE) process.

11. The method of claim 1, wherein at least the second dry etching process comprises forming one of rows and columns of active areas in a memory cell matrix.

12. A polysilicon etching process for forming triple polysilicon split gate electrodes in an EEPROM flash memory array with improved electrical properties and reduced dry etching residues comprising the steps of:
    providing a first polysilicon select gate structure comprising a gate oxide formed over a semiconductor substrate, an overlying polysilicon select gate electrode, an overlying first insulating interpoly layer, dielectric sidewall spacers, and a tunnel oxide layer formed adjacent the first polysilicon gate structure and overlying the semiconductor substrate;
    blanket depositing a first polysilicon layer over the first polysilicon select gate structure;
    etching back the first polysilicon layer through a thickness portion according to a first dry etching process;
    blanket depositing a dielectric antireflectance coating (DARC) layer over the first polysilicon layer;
    lithographically patterning and etching according to a second dry etching process a portion of the first polysilicon layer to form active areas;
    blanket depositing a second insulating interpoly layer over the first polysilicon layer;
    blanket depositing a second polysilicon layer over the second interpoly layer; and, lithographically patterning and dry etching according to a third dry etching process through a thickness portion of the second polysilicon layer to stop on the second insulating interpoly layer to form a polysilicon control gate.

13. The method of claim 12, further comprising the step of dry etching according to a fourth dry etching process through the second insulating interpoly layer and a thickness portion of the first polysilicon layer to form a polysilicon floating gate.

14. The method of claim 13, wherein the polysilicon floating gate is aligned over a portion of the polysilicon select gate and self-aligned with the overlying polysilicon control gate.

15. The method of claim 12, wherein at least the first dry etching process comprises a downstream chemically dependent etching (CDE) process.

16. The method of claim 12, wherein the first polysilicon layer is deposited to a thickness greater by a factor of about 1 to about 2.5 compared to a final thickness following the step of etching back.

17. The method of claim 12, wherein the DARC layer is deposited to a thickness between about 500 Angstroms and about 1500 Angstroms.

18. The method of claim 12, wherein the first insulating interpoly layer comprises thermally grown silicon oxide.

19. The method of claim 11, wherein the second insulating interpoly layer comprises sequential layers of silicon oxide/silicon nitride/silicon oxide (ONO).

20. A method for forming triple polysilicon split gate electrodes in an EEPROM flash memory array comprising the steps of;

providing a first gate structure comprising a gate dielectric formed over a semiconductor substrate, an overlying first polysilicon electrode and an overlying first dielectric insulating layer;

forming a first polysilicon layer over the first gate structure;

etching back the first polysilicon layer according to a first dry etching process;

forming a dielectric anti-reflectance coating (DARC) layer over the first polysilicon layer;

lithographically patterning and etching according to a second dry etching process through a thickness portion of the first polysilicon layer;

forming a second dielectric insulating layer over the first polysilicon layer;

forming a second polysilicon layer over the second dielectric insulating layer; and, lithographically patterning and dry etching according to a respective third and fourth dry etching process through a thickness portion of the respective second and first polysilicon layers to respectively form third and second polysilicon gate electrodes.

* * * * *